United States Patent
Jeong et al.

(10) Patent No.: US 9,520,897 B2
(45) Date of Patent: Dec. 13, 2016

(54) APPARATUS AND METHOD FOR TRANSMITTING/RECEIVING DATA IN COMMUNICATION SYSTEM

(71) Applicant: Samsung Electronics Co., Ltd., Gyeonggi-do (KR)

(72) Inventors: Hong-Sil Jeong, Seoul (KR); Ismael Gutierrez, Middlesex (GB); Sung-Ryul Yun, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 13/755,640

(22) Filed: Jan. 31, 2013

(65) Prior Publication Data

US 2013/0198593 A1    Aug. 1, 2013

(30) Foreign Application Priority Data

Jan. 31, 2012 (KR) .................. 10-2012-0010104

(51) Int. Cl.
*H03M 13/00*  (2006.01)
*H03M 13/29*  (2006.01)
(Continued)

(52) U.S. Cl.
CPC ....... *H03M 13/005* (2013.01); *H03M 13/2906* (2013.01); *H03M 13/6362* (2013.01);
(Continued)

(58) Field of Classification Search
CPC .................................................. H03M 13/005
(Continued)

(56) References Cited

U.S. PATENT DOCUMENTS 5,668,820 A      9/1997  Ramesh et al.
6,308,294 B1 *  10/2001  Ghosh et al. ............... 714/751
(Continued)

FOREIGN PATENT DOCUMENTS

CN    101034953    9/2007
CN    101567697    10/2009
(Continued)

OTHER PUBLICATIONS

Chinese Office Action dated Jul. 13, 2016 issued in counterpart application No. 201380007438.6, 11 pages.
(Continued)

*Primary Examiner* — Joseph D Torres
(74) *Attorney, Agent, or Firm* — The Farrell Law Firm, P.C.

(57) ABSTRACT

An apparatus and method for generating a parity bit sequence to be transmitted or received over a plurality of frames in a communication system are provided. The method includes puncturing a first parity bit sequence by encoding, the first parity bit sequence with a first puncturing pattern; outputting, as a basic parity bit sequence, non-punctured parity bits that are remaining after the puncturing of the first parity bit sequence with the first puncturing pattern; puncturing a second parity bit sequence that is punctured by puncturing of the first parity bit sequence with the first puncturing pattern, the second parity bit sequence with a second puncturing pattern; and outputting, as an additional parity bit sequence, non-punctured parity bits that are remaining after the puncturing of the second parity bit sequence with the second puncturing pattern.

6 Claims, 10 Drawing Sheets

(51) Int. Cl.
*H04L 1/00* (2006.01)
*H03M 13/11* (2006.01)
*H03M 13/15* (2006.01)

(52) U.S. Cl.
CPC .......... *H04L 1/0057* (2013.01); *H04L 1/0069* (2013.01); *H03M 13/1102* (2013.01); *H03M 13/152* (2013.01)

(58) Field of Classification Search
USPC ........................................................ 714/790
See application file for complete search history.

(56) References Cited

U.S. PATENT DOCUMENTS

| | | | |
|---|---|---|---|
| 6,532,562 B1 * | 3/2003 | Chou et al. | 714/776 |
| 6,594,798 B1 * | 7/2003 | Chou et al. | 714/820 |
| 6,604,216 B1 * | 8/2003 | Javerbring et al. | 714/751 |
| 6,851,084 B2 | 2/2005 | Pattavina | 714/776 |
| 6,977,888 B1 * | 12/2005 | Frenger et al. | 370/218 |
| 7,072,307 B2 * | 7/2006 | Tong et al. | 370/253 |
| 7,483,389 B2 * | 1/2009 | Tong et al. | 370/253 |
| 7,512,860 B2 * | 3/2009 | Miyazaki et al. | 714/751 |
| 7,584,404 B2 * | 9/2009 | Kozintsev et al. | 714/776 |
| 8,145,970 B2 * | 3/2012 | Lee et al. | 714/751 |
| 2002/0046379 A1 * | 4/2002 | Miki et al. | 714/749 |
| 2003/0229840 A1 * | 12/2003 | Pattavina | 714/776 |
| 2004/0123211 A1 * | 6/2004 | Kozintsev et al. | 714/749 |
| 2004/0187069 A1 | 9/2004 | Pietraski et al. | |
| 2005/0204242 A1 * | 9/2005 | Chou et al. | 714/741 |
| 2006/0059401 A1 * | 3/2006 | Ko | 714/752 |
| 2009/0067527 A1 | 3/2009 | Lee et al. | |
| 2010/0037120 A1 * | 2/2010 | Limberg | 714/758 |
| 2010/0115372 A1 | 5/2010 | Trachewsky et al. | |
| 2010/0199145 A1 | 8/2010 | Kang et al. | |
| 2010/0287453 A1 | 11/2010 | Balachandran et al. | |
| 2011/0119568 A1 * | 5/2011 | Jeong et al. | 714/790 |

FOREIGN PATENT DOCUMENTS

| | | |
|---|---|---|
| EP | 1 445 885 | 8/2004 |
| JP | 11-502679 | 3/1999 |
| WO | WO 2011/062424 | 5/2011 |

OTHER PUBLICATIONS

Japanese Office Action dated Sep. 12, 2016 issued in counterpart application No. 2014-555483, 8 pages.

* cited by examiner

APPARATUS AND METHOD FOR TRANSMITTING/RECEIVING DATA IN COMMUNICATION SYSTEM

PRIORITY

This application claims priority under 35 U.S.C. §119(a) to a Korean Patent Application filed in the Korean Intellectual Property Office on Jan. 31, 2012 and assigned Serial No. 10-2012-0010104, the entire content of which is incorporated herein by reference.

BACKGROUND OF THE INVENTION

1. Field of the Invention

The present invention relates generally to an apparatus and method for transmitting/receiving data in a communication system, and more particularly, to an apparatus and method for generating parity bits for data transmission/reception in a communication system.

2. Description of the Related Art

Generally, in communication systems, link performance may degrade due to noise, fading, Inter-Symbol Interference (ISI), etc. Therefore, development of technology for overcoming such issues is needed in order to improve the link performance of the communication systems. In particular, development of such technologies is especially important for high-speed digital communication systems such as the next-generation mobile communications, digital broadcasting and mobile Internet, which require high data throughput and reliability.

Some technologies proposed for overcoming these issues may include an error-correcting code. An error-correcting code is used in a typical technique for improving the reliability of communication by efficiently restoring the distortion of information. Examples of error-correcting codes include a turbo code, a Low Density Parity Check (LDPC) code, etc.

When transmitting information using error-correcting codes in a communication system, a transmission device typically determines or selects bits to transmit, from a systematic bit sequence corresponding to the desired information to transmit and a parity bit sequence obtained by encoding. The transmission device of the communication system generates a frame having a predetermined format using the determined bits, and transmits the desired information in units of the generated frame.

For this transmission device of the communication system, a technique for transmitting parity bits over a plurality of frames must be prepared, not only to obtain additional diversity gain, but also to minimize the number of additional modules needed for encoding or decoding.

In particular, for a communication system supporting broadcast services, such as Digital Video Broadcasting-2nd Generation Terrestrial (DVB-T2) and DVB-Next Generation Handheld (DVB-NGH), technology for transmitting a parity bit sequence in addition to the basically transmitted parity bit sequence has been proposed to obtain additional diversity gain.

However, technology for generating a parity bit sequence to be additionally transmitted must be optimized in order to obtain sufficient diversity gain in the communication system supporting broadcast services.

SUMMARY OF THE INVENTION

Accordingly, the present invention has been designed to solve at least the above-mentioned problems, and provide at least the advantages described below. An aspect of the present invention provides a data transmission apparatus and method for generating additional parity bits provided to obtain additional diversity gain in a communication system that transmits parity bits over a plurality of frames. Another aspect of the present invention provides a data transmission apparatus and method for generating one first parity bit sequence (or basic parity bit sequence) and at least one additional parity bit sequence from a parity bit sequence output by encoding. Further another aspect of the present invention provides a data reception apparatus and method for decoding an information bit sequence using at least one first parity bit sequence (or basic parity bit sequence) and at least one additional parity bit sequence, which are received from a transmission device.

In accordance with one aspect of the present invention, there is provided a method for generating a parity bit sequence to be transmitted over a plurality of frames in a transmission device of a communication system. The method includes puncturing a first parity bit sequence by encoding, the first parity bit sequence with a first puncturing pattern; outputting, as a basic parity bit sequence, non-punctured parity bits that are remaining after the puncturing of the first parity bit sequence with the first puncturing pattern; puncturing a second parity bit sequence that is punctured by puncturing of the first parity bit sequence with the first puncturing pattern, the second parity bit sequence with a second puncturing pattern; and outputting, as an additional parity bit sequence, non-punctured parity bits that are remaining after the puncturing of the second parity bit sequence with the second puncturing pattern.

In accordance with another aspect of the present invention, there is provided an apparatus for generating a parity bit sequence to be transmitted over a plurality of frames in a transmission device of a communication system. The apparatus includes a basic parity generator for puncturing a first parity bit sequence by encoding the first parity bit sequence with a first puncturing pattern, and outputting, as a basic parity bit sequence, non-punctured parity bits that are remaining after the puncturing of the first parity bit sequence with the first puncturing pattern; and an additional parity generator for puncturing a second parity bit sequence that is punctured by the puncturing of the first parity bit sequence with the first puncturing pattern, the second parity bit sequence with a second puncturing pattern, and outputting, as an additional parity bit sequence, non-punctured parity bits that are remaining after the puncturing of the second parity bit sequence with the second puncturing pattern.

In accordance with further another aspect of the present invention, there is provided a method for restoring a parity bit sequence that is transmitted over a plurality of frames, in a reception device of a communication system. The method includes extracting a first basic parity bit sequence and at least one first additional parity bit sequence from a received frame; reconstructing a second basic parity bit sequence by inserting puncturing parity bits into the extracted first basic parity bit sequence using a first masking pattern; and reconstructing at least one second additional parity bit sequence by inserting puncturing parity bits into the extracted at least one first additional parity bit sequence using a second masking pattern, wherein the first masking pattern and a secondary masking pattern are generated by a predetermined masking pattern, and the second masking pattern is generated using the first masking pattern and the secondary masking pattern.

In accordance with yet another aspect of the present invention, there is provided an apparatus for restoring a parity bit sequence that is transmitted over a plurality of frames, in a reception device of a communication system. The apparatus includes a frame decomposer for extracting a first basic parity bit sequence and at least one first additional parity bit sequence from a received frame; and a parity reconstruction unit for reconstructing a second basic parity bit sequence by inserting puncturing parity bits into the extracted first basic parity bit sequence using a first masking pattern, and reconstructing at least one second additional parity bit sequence by inserting puncturing parity bits into the extracted at least one first additional parity bit sequence using a second masking pattern, wherein the first masking pattern and a secondary masking pattern are generated by a predetermined masking pattern, and the second masking pattern is generated using the first masking pattern and the secondary masking pattern.

BRIEF DESCRIPTION OF THE DRAWINGS

The above and other aspects, features and advantages of certain embodiments of the present invention will be more apparent from the following description taken in conjunction with the accompanying drawings, in which.

DETAILED DESCRIPTION OF EMBODIMENTS OF THE PRESENT INVENTION

Figure 1:
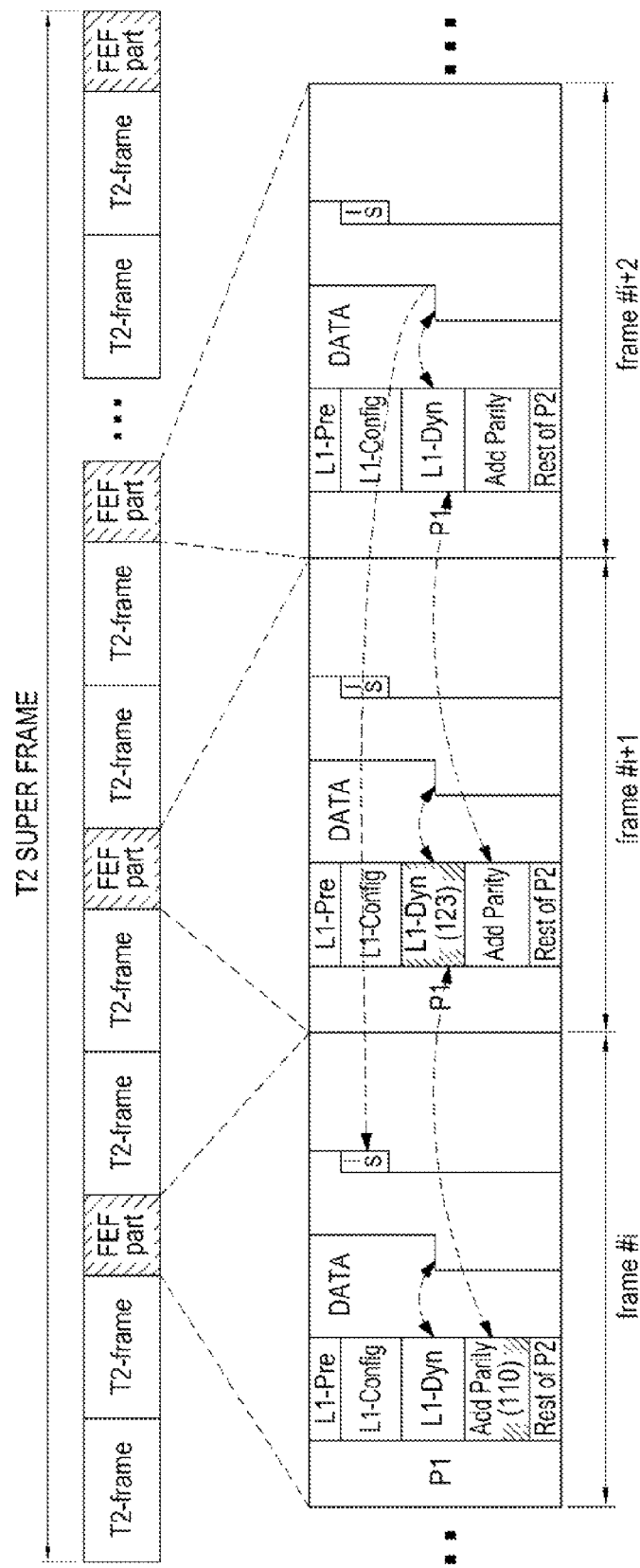
FIG. 1 is a diagram illustrating a structure of a superframe according to an embodiment of the present invention.

Embodiments of the present invention are described in detail with reference to the accompanying drawings. In the following description, specific details such as detailed configuration and components are merely provided to assist the overall understanding of embodiments of the present invention. Therefore, various changes and modifications of the embodiments described herein can be made without departing from the scope and spirit of the invention. In addition, descriptions of well-known functions and constructions may be omitted for clarity and conciseness. Throughout the drawings, the same drawing reference numerals will be understood to refer to the same elements, features and structures.

In below-described embodiments of the present invention, an apparatus and method, which generate an additional parity bit sequence(s) to be transmitted to obtain the sufficient diversity gain, by additionally puncturing parity bits that are punctured during puncturing for generation of a basic parity bit sequence, using a predetermined puncturing pattern, are described in detail.

A masking pattern may also be used instead of the puncturing pattern used to generate the basic parity bit sequence and the puncturing pattern used to generate the additional parity bit sequence in accordance with embodiments of the present invention.

Although a hardware structure is described as a way to generate an additional parity bit sequence in below-described embodiments of the present invention, the same generation may be implemented not only by the hardware structure, but also by software or a combination thereof in an actual implementation in accordance with embodiments of the present invention.

FIG. 1 is a diagram illustrating a structure of a superframe according to an embodiment of the present invention. More specifically, FIG. 1 illustrates a DVB-T2 frame, which is a superframe used in a broadcasting system, for example, a DVB-T2 system. The DVB-T2 system refers to a system supporting $2^{nd}$ generation digital terrestrial television broadcasting, which is operated by a Digital Video Broadcasting (DVB) organization that covers one of the global Digital Television (DTV) broadcast standards.

Referring to FIG. 1, a T2 superframe includes a plurality of T2 frames and a plurality of Future Extension Frame (FEF) parts. Each FEF part is inserted between a predetermined number of T2 frames for the introduction of the state-of-the-art technology such as Multiple Input Multiple Output (MIMO) in consideration of the complement and evolution of the DVB-T2 standard. For example, FIG. 1 illustrates a T2 superframe with a structure in which FEF parts are inserted at an interval of every two T2 frames. However, embodiments of the present invention are not be limited to this particular insertion cycle of the FEF part, and other intervals may be used in accordance with embodiments of the present invention.

For embodiments of the present invention, in a frame #i corresponding to an i-th FEF part, additional parity bits for a frame #(i+1) corresponding to the next (i+1)-th FEF part are transmitted. Specifically, a frame corresponding to each FEF part includes an additional parity part 110 for transmission of additional parity bits, which corresponds to an L1-Dyn part 120 that is included in the next frame for transmission of first parity bits (also known as basic parity bits). This structure is provided in order to obtain diversity gain.

Figure 2:
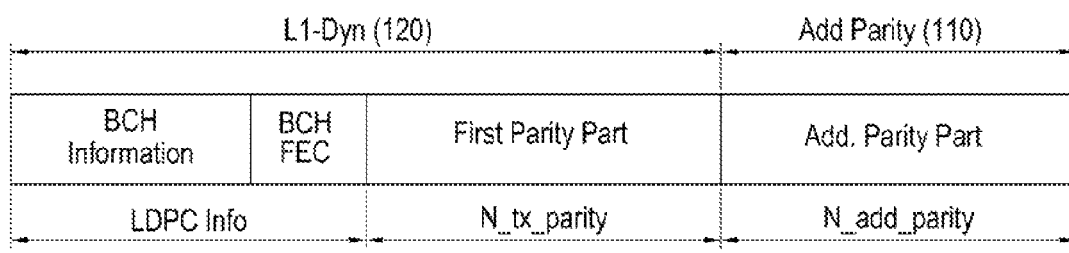
FIG. 2 is a diagram illustrating a data structure for transmission of parity bits according to an embodiment of the present invention.

FIG. 2 is a diagram illustrating a data structure for transmission of parity bits according to an embodiment of the present invention. For example, FIG. 2 illustrates a structure of the additional parity part 110 and the L1-Dyn part 120 shown in FIG. 1.

Referring to FIG. 2, the L1-Dyn part 120 includes a Broadcast Channel (BCH) information field and a BCH Forward Error Correction (FEC) field, which are provided to record LDPC information, and a first parity part (also referred to herein as a basic parity part) provided to record N-th transmission parity bits (i.e., bits forming an N-th transmission parity). The information recorded in the L1-Dyn part 120 may be in a form that can be decoded without additional parity bits.

The additional parity part 110 is attached to the previous frames in order to achieve the high diversity gain.

Figure 3:
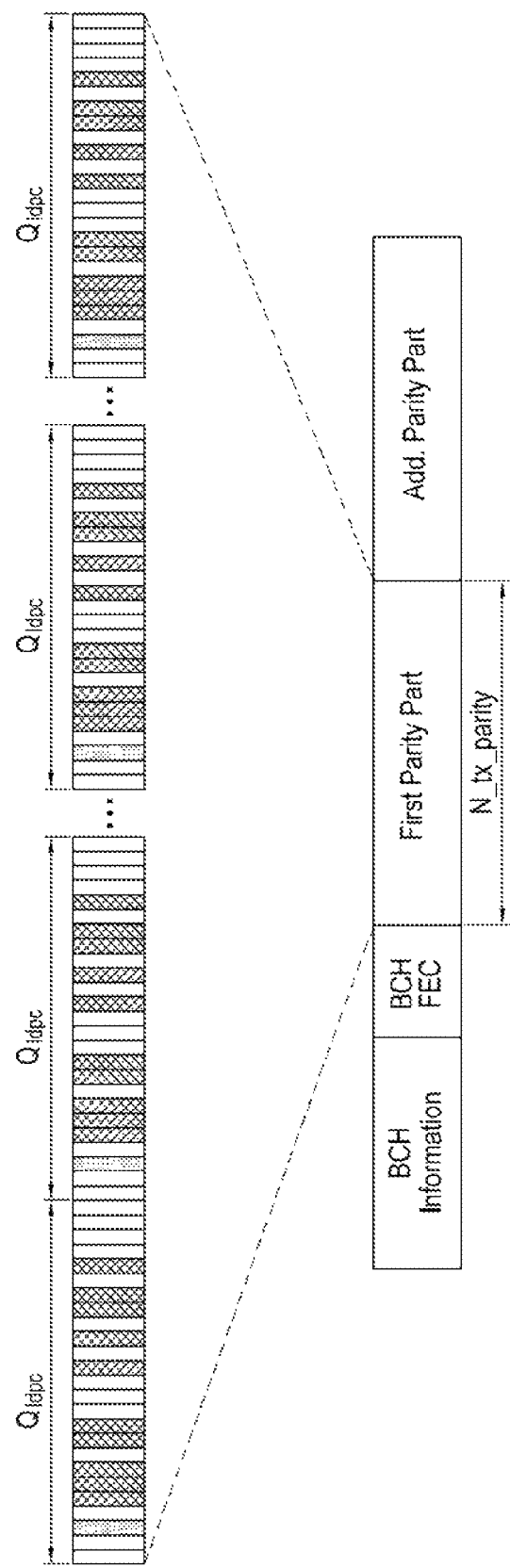
FIG. 3 is a diagram illustrating a structure of the first parity part shown in FIG. 2 according to an embodiment of the present invention.

FIG. 3 is a diagram illustrating a structure of the first parity part shown in FIG. 2 according to an embodiment of the present invention.

As illustrated in FIG. 3, the first parity part includes non-punctured parity bits. These parity bits, which are left after puncturing the parity bits generated by encoding in accordance with a predetermined puncturing pattern, are transmitted by the first parity part.

Figure 4:
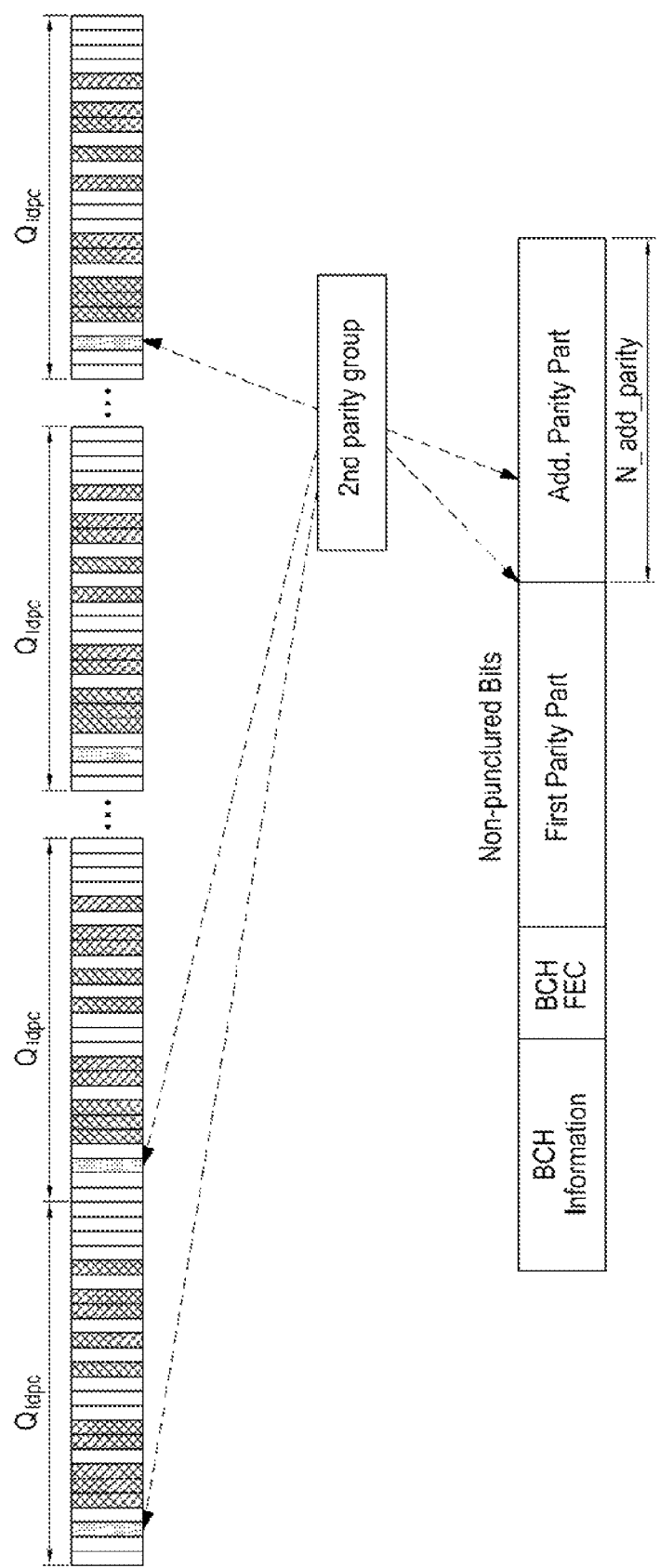
FIG. 4 is a diagram illustrating a structure of the additional parity part shown in FIG. 2 according to an embodiment of the present invention.

FIG. 4 is a diagram illustrating a structure of the additional parity part shown in FIG. 2 according to an embodiment of the present invention.

As illustrated in FIG. 4, the additional parity part includes parity bits that are selected from the punctured parity bits. Some of these parity bits, which are selected from the parity bits that were punctured during puncturing for selecting the parity bits recorded in the first parity part among the parity bits generated by encoding, are transmitted by the additional parity part.

Figure 5:
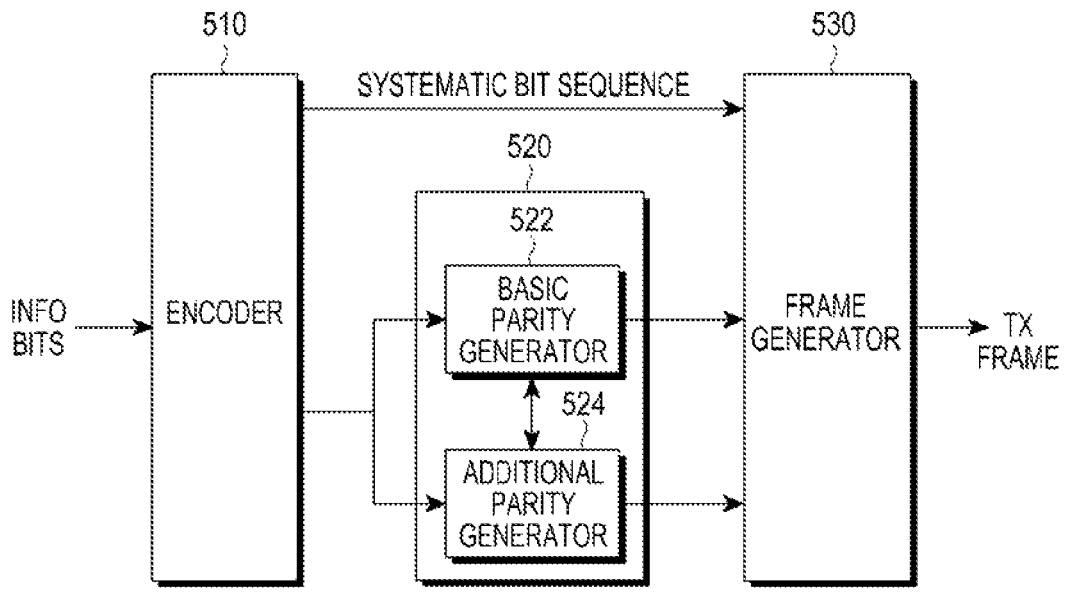
FIG. 5 is a block diagram illustrating a configuration of a transmission frame generation device in a transmission device of a communication system according to an embodiment of the present invention.

FIG. 5 is a block diagram illustrating a configuration of a transmission frame generation device in a transmission device of a communication system according to an embodiment of the present invention. Specifically, FIG. 5 illustrates a configuration of a device for generating a parity bit sequence to be transmitted over a plurality of frames in a transmission device of a communication system.

Referring to FIG. 5, an encoder 510 encodes received information bits to be transmitted, using a predetermined coding technique and coding rate. The coding technique and/or coding rate used for this purpose may be set as a specific technique and/or value in advance according to an agreement, or may be appropriately changed in consideration of channel conditions.

A systematic bit sequence corresponding to information bits and at least one parity bit sequence corresponding to an additional parity bit sequence are output by encoding by the encoder 510. In FIG. 5, it will be assumed that one parity bit sequence is output by the encoder 510.

The systematic bit sequence output by the encoder 510 is provided to a frame generator 530. The parity bit sequence output by the encoder 510 is provided to a parity reconstruction unit 520.

The parity reconstruction unit 520 generates a basic parity bit sequence (i.e., a first parity bit sequence) and at least one additional parity bit sequence from the parity bit sequence provided from the encoder 510. In the present example according to FIG. 5, one additional parity bit sequence is generated by the parity reconstruction unit 520.

To this end, the parity reconstruction unit 520 includes a basic parity generator 522 for generating a basic parity bit sequence, and an additional parity generator 524 for generating an additional parity bit sequence.

The basic parity generator 522 outputs, as a basic parity bit sequence, non-punctured parity bits that are left after puncturing the parity bit sequence output by encoding, using a predetermined puncturing pattern (hereinafter referred to as a first puncturing pattern). The first puncturing pattern may be generated or selected by the basic parity generator 522, or may be provided from an external entity.

If the number of non-punctured parity bits exceeds the number of basic parity bits that will be finally output, the basic parity generator 522 may select the same number of parity bits as the number of basic parity bits to be finally output, from the non-punctured parity bits, or may remove the same number of parity bits as the number by which the non-punctured parity bits exceed the basic parity bits. If the number of non-punctured parity bits is less than the number of basic parity bits to be finally output, the basic parity generator 522 may output the same number of basic parity bits as the desired number by repeating some of the non-punctured parity bits.

However, the number of non-punctured parity bits may be matched to the number of basic parity bits to be finally output, by efficiently using the first puncturing pattern.

The basic parity generator 522 provides the parity bits that are not output as a basic parity bit sequence to the additional parity generator 524 by puncturing the parity bit sequence output, by performing encoding in accordance with the first puncturing pattern. However, when the additional parity generator 524 generates an additional parity bit sequence from the parity bit sequence provided from the encoder 510, it is not necessary to provide the parity bits punctured by the basic parity generator 522.

The additional parity generator 524 punctures the parity bits punctured by the basic parity generator 522 or the parity bit sequence provided by the encoder 510, using a predetermined puncturing pattern (hereinafter referred to as a second puncturing pattern), and outputs the non-punctured parity bits, which are left after the puncturing, as an additional parity bit sequence. The second puncturing pattern may be generated or selected by the additional parity generator 524, or may be provided from an external entity.

If the number of non-punctured parity bits exceeds the number of additional parity bits that will be finally output, the additional parity generator 524 may select the same number of parity bits as the number of additional parity bits to be finally output, from the non-punctured parity bits, or may remove the same number of parity bits as the number by which the non-punctured parity bits exceed the additional parity bits. If the number of non-punctured parity bits is less than the number of additional parity bits to be finally output, the additional parity generator 524 may output as many additional parity bits as the desired number by repeating some of the non-punctured parity bits.

However, the number of non-punctured parity bits may be matched to the number of additional parity bits to be finally output, by efficiently using the second puncturing pattern.

The frame generator 530 generates a frame to be transmitted (hereinafter referred to as a transmission frame) based on the systematic bit sequence provided from the encoder 510 and the basic parity bit sequence and at least one additional parity bit sequence provided from the parity reconstruction unit 520. For example, the frame generator 530 may generate a transmission frame in the structure shown in FIGS. 1 to 4.

Figure 6:
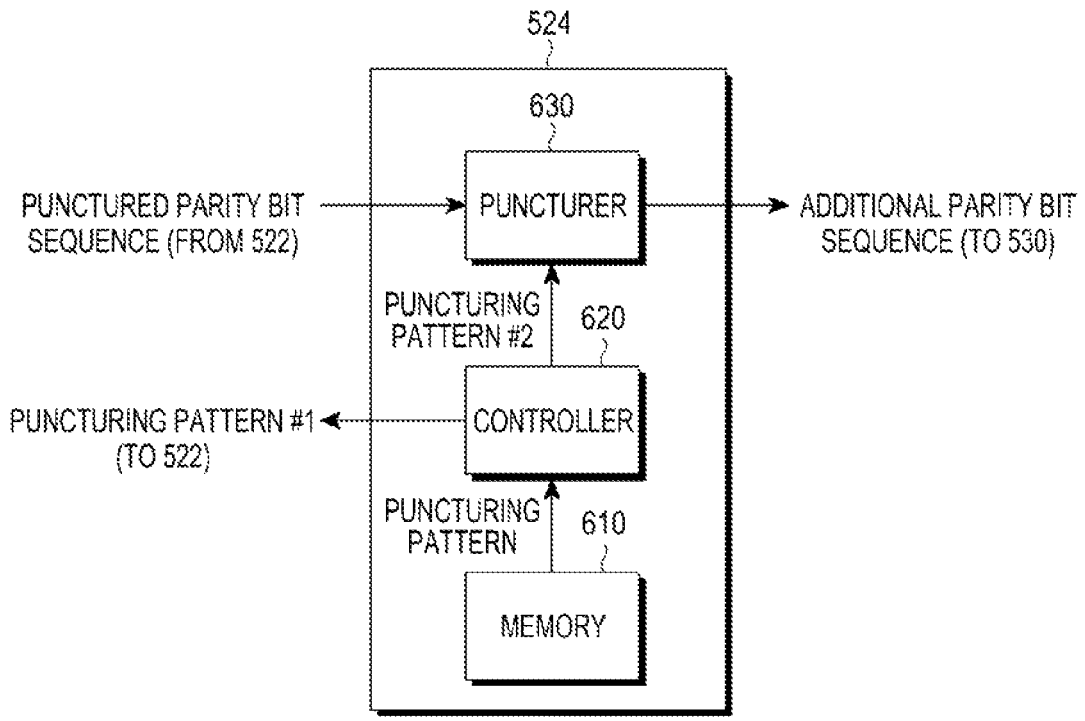
FIG. 6 is a block diagram illustrating an example of a configuration of the additional parity generator shown in FIG. 5 according to an embodiment of the present invention.

FIG. 6 is a block diagram illustrating an example of a configuration of the additional parity generator 524 shown in FIG. 5 according to an embodiment of the present invention.

Referring to FIG. 6, the additional parity generator 524 punctures the punctured parity bits provided from the basic parity generator 522 using the second puncturing pattern, and outputs, as an additional parity bit sequence, the non-punctured parity bits that are left after the puncturing with the second puncturing pattern. The second puncturing pattern may be generated by the puncturing pattern known in advance, or may be provided from an external entity.

For example, if the second puncturing pattern is generated by the known puncturing pattern, the additional parity generator 524 generates or selects the first and second puncturing patterns using the known puncturing pattern, and provides the first puncturing pattern to the basic parity generator 522. The additional parity generator 524 punctures the punctured parity bits provided from the basic parity generator 522 using the second puncturing pattern.

To perform the above-described operations, the additional parity generator 524 includes a puncturer 630, a controller 620 and a memory 610. As described above, however, the additional parity generator 524 may include only the puncturer 630, while the controller 620 and the memory 610 may be separately provided from an external entity. In this case, the memory 610 of the additional parity generator 524 may store one or more puncturing patterns.

The controller 620 generates the first and second puncturing patterns using the puncturing pattern provided from the memory 610, and provides the generated first puncturing pattern to the basic parity generator 522. The controller 620 provides the generated second puncturing pattern to the puncturer 630.

As an alternative, the controller 620 may receive the first and second puncturing patterns directly from the memory 610, instead of generating the first and second puncturing patterns using the puncturing pattern provided from the memory 610. In this case, the controller 620 may not need to separately perform an operation of generating the first and second puncturing patterns. In other words, in this case, the controller 620 simply reads the first and second puncturing patterns from the memory 610 and provides the first and second puncturing patterns to the basic parity generator 622 and the puncturer 630, respectively.

The puncturer 630 punctures the punctured parity bits provided from the basic parity generator 522 using the second puncturing pattern provided by the controller 620. The puncturer 630 outputs the non-punctured parity bits that are left after the puncturing with the second puncturing pattern is performed, as an additional parity bit sequence.

In the foregoing description, for the generation of the first and second puncturing patterns, the memory 610 may provide the controller 620 not only with the same puncturing pattern but also with different puncturing patterns. The first and second puncturing patterns generated by the controller 620 may have the same or different puncturing patterns.

Figure 7:
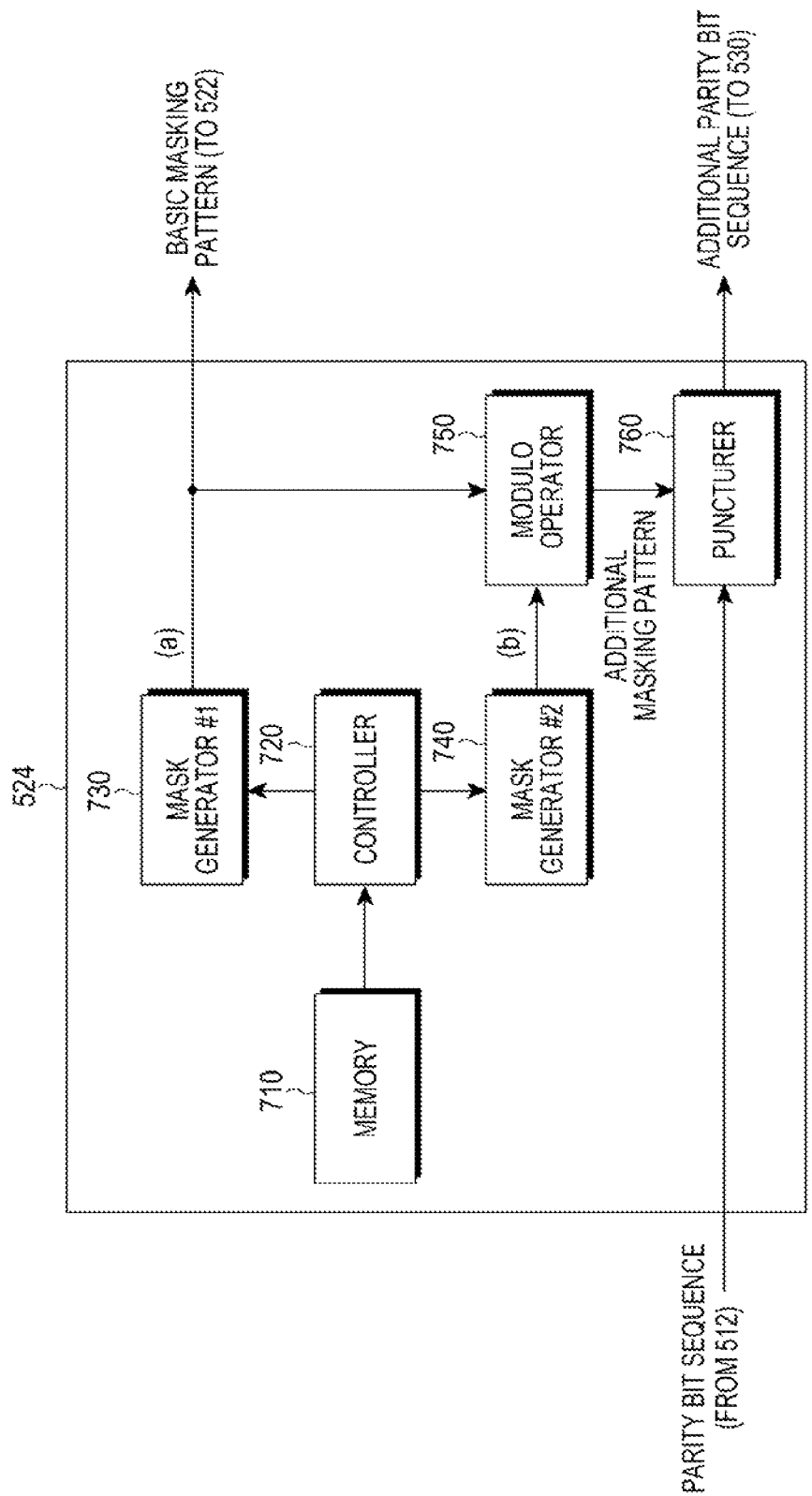
FIG. 7 is a block diagram illustrating another example of a configuration of the additional parity generator shown in FIG. 5 according to an embodiment of the present invention.

FIG. 7 is a block diagram illustrating another example of a configuration of the additional parity generator shown in FIG. 5 according to an embodiment of the present invention.

Referring to FIG. 7, the additional parity generator 524 punctures the parity bits provided from the encoder 510 using an additional masking pattern, and outputs the non-punctured parity bits, which are left after the puncturing, as an additional parity bit sequence. The additional masking pattern may be generated by the puncturing pattern known in advance, or may be provided from an external entity.

For example, if the additional masking pattern is generated by the known puncturing pattern, the additional parity generator 524 generates or selects a basic masking pattern and the additional masking pattern using the known puncturing pattern, and provides the basic masking pattern to the basic parity generator 522. The additional parity generator 524 punctures the parity bits provided from the encoder 510 using the additional masking pattern.

For example, the additional parity generator 524 may generate an additional masking pattern using a secondary masking pattern and the basic masking pattern, which are generated by the known puncturing pattern.

In order to perform the above-described operations, the additional parity generator 524 includes a memory 710, a controller 720, a first mask generator 730, a second mask generator 740, a modulo operator 750, and a puncturer 760. However, the controller 720 and the memory 710, which are included as components of the additional parity generator 524 in FIG. 7, may be separately provided from an external entity in accordance with embodiment of the present invention.

In a detailed description of the configuration of the additional parity generator 524, the memory 710 may store one or more masking patterns to be used to generate a basic masking pattern (a) and/or a secondary masking pattern (b). The memory 710 provides one of the stored masking patterns to the controller 720 in response to a request from the controller 720.

For example, the memory 710 may separately manage one or more masking patterns to be used to generate the basic masking pattern (a), and one or more masking patterns to be used to generate the secondary masking pattern (b). In this case, the memory 710 may separately provide, to the controller 720, the masking pattern to be used to generate the basic masking pattern (a) and the masking pattern to be used to generate the secondary masking pattern (b).

The controller 720 provides the masking patterns read out from the memory 710 to the first and second mask generators 730 and 740.

The first mask generator 730 generates the basic masking pattern (a) using a predetermined masking pattern. For example, the predetermined masking pattern may be provided from the memory 710 by the controller 720, or may be generated or selected from the inside by the controller 720.

The second mask generator 740 generates the secondary masking pattern (b) using a predetermined masking pattern. For example, the predetermined masking pattern may be provided from the memory 710 by the controller 720, or may be generated or selected from the inside by the controller 720. The secondary masking pattern (b) is a masking pattern that is used to generate an additional masking pattern, together with the basic masking pattern (a).

The modulo operator 750 generates an additional masking pattern by performing an OR operation or a modulo operation on the basic masking pattern (a) generated by the first mask generator 730 and the secondary masking pattern (b) generated by the second mask pattern 740.

The puncturer 760 punctures the parity bit sequence output from the encoder 510 using the additional masking pattern generated by the modulo operator 750. The puncturer 760 outputs, as an additional parity bit sequence, the non-punctured parity bits that are left after the puncturing with the additional masking pattern.

Figure 8:
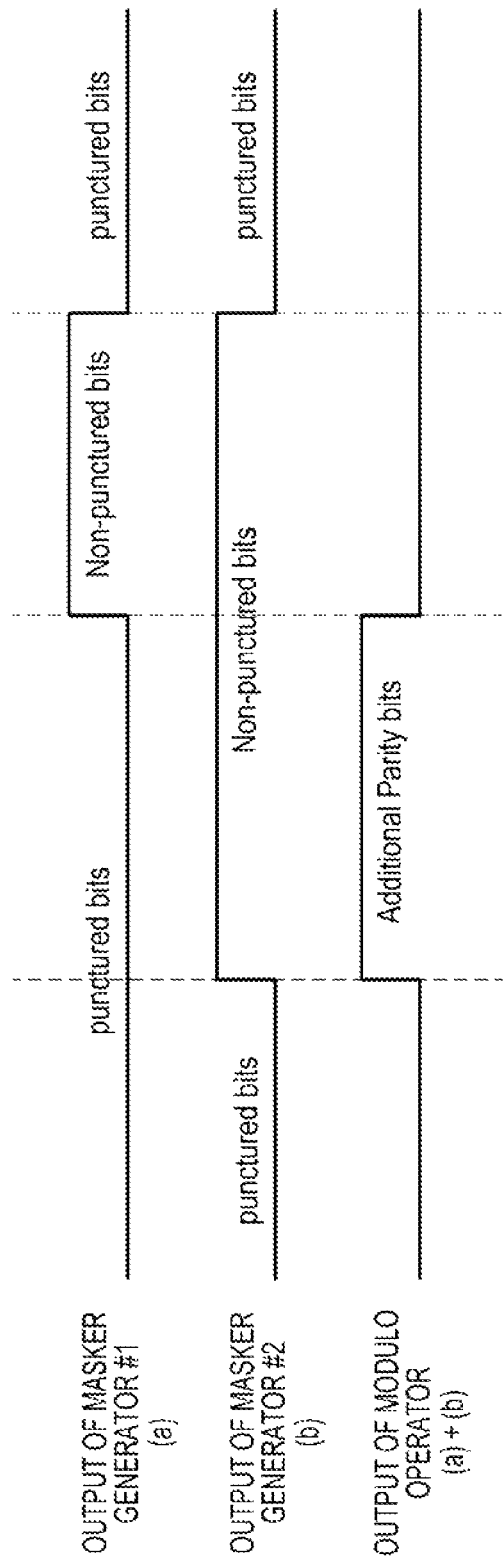
FIG. 8 is a diagram illustrating operation timing in the additional parity generator shown in FIG. 7 according to an embodiment of the present invention.

FIG. 8 is a diagram illustrating operation timing in the additional parity generator shown in FIG. 7 according to an embodiment of the present invention. Specifically, FIG. 8 illustrates operation timing for generating an additional masking pattern based on the basic masking pattern and the secondary masking pattern.

Referring to FIG. 8, an interval in which additional parity bits are output in the additional masking pattern generated by the modulo operation (i.e., an interval where puncturing for a parity bit sequence is not performed) is defined by an interval where puncturing in the basic masking pattern is performed, and an interval where puncturing in the secondary masking pattern is not performed.

Table 1 below shows an example of determining an additional masking pattern based on the basic masking pattern and the secondary masking pattern.

TABLE 1

| Basic masking pattern | Secondary masking pattern | Additional masking pattern |
|---|---|---|
| Puncturing interval | Puncturing interval | Puncturing interval |
| Puncturing interval | Non-puncturing interval | Non-puncturing interval |
| Non-puncturing interval | Non-puncturing interval | Puncturing interval |
| Non-puncturing interval | Puncturing interval | Puncturing interval |

In accordance with Table 1, an additional parity bit sequence may be output by non-puncturing (i.e., not puncturing) the parity bit sequence output by encoding, only when puncturing for the parity bit sequence output by encoding is performed by the basic masking pattern and puncturing is not required by the secondary masking pattern.

Table 1 shows an example for generating an additional masking pattern, and the additional masking pattern may be generated in a variety of different patterns.

Figure 9:
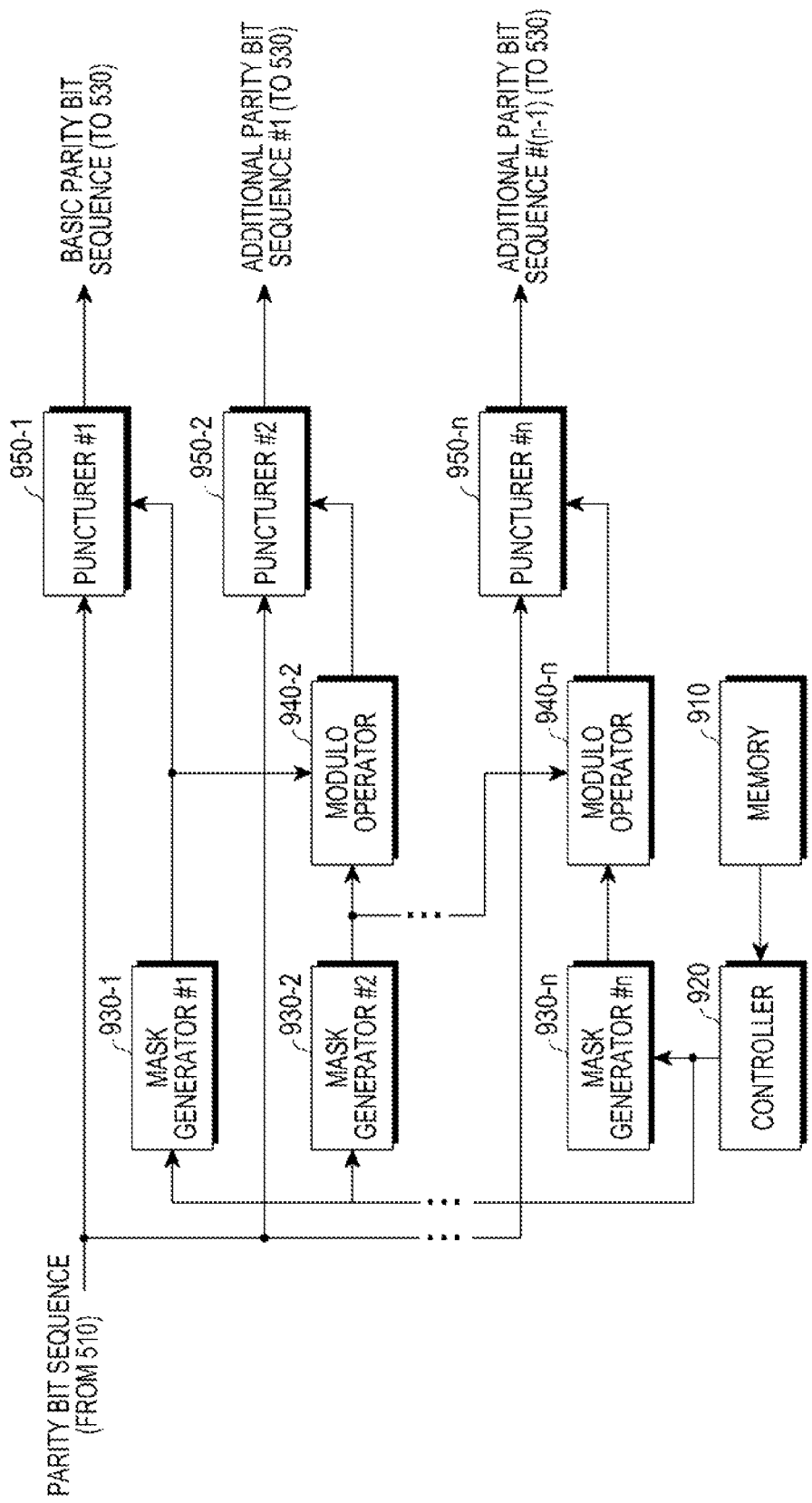
FIG. 9 is a block diagram illustrating further another example of a configuration of the additional parity generator shown in FIG. 5 according to an embodiment of the present invention.

FIG. 9 is a block diagram illustrating further another example of a configuration of the additional parity generator 524 shown in FIG. 5 according to an embodiment of the present invention. Specifically, FIG. 9 illustrates an example of a configuration of the additional parity generator 524 shown in FIG. 7, which is extended to generate a plurality of additional parity bit sequences.

The additional parity generator 524 shown in FIG. 9 additionally includes mask generators 930-1, 930-2, . . . , 930-n, modulo operators 940-1, 940-2, . . . , 940-n, and puncturers 950-1, 950-2, . . . , 950-n, considering the number of additional parity bit sequences to generate. As an example, FIG. 9 shows that in order to generate (n−1) additional parity bit sequences, the additional parity generator 524 has (n−1) generators that each include a mask generator, a modulo operator and a puncturer, the generators being matched to the additional parity bit sequences to be generated. In other words, the additional parity generator 524 includes (n−1) generators for generating their own additional parity bit sequences.

The modulator operator 940-n forming each of the (n−1) generators generates an additional masking pattern by performing a modulo operation on a secondary masking pattern generated by a mask generator constituting a means that is provided in the front stage to generate an additional parity bit sequence, and on a secondary masking pattern generated by its own mask generator.

Figure 10:
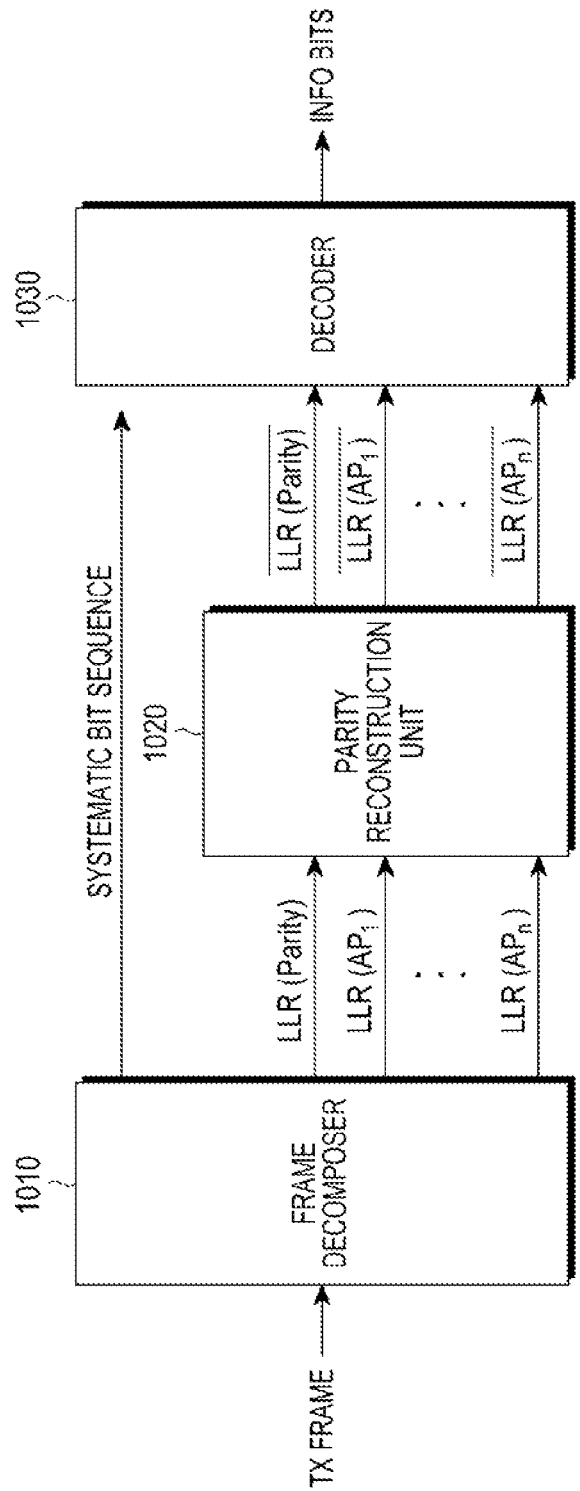
FIG. 10 is a block diagram illustrating components included in a reception device and correspond to the configuration of the transmission device, which is shown in FIG. 9 according to an embodiment of the present invention.

FIG. 10 is a block diagram illustrating a configuration for restoring information bits from a transmission frame in a transmission device of a communication system according to an embodiment of the present invention. Specifically, FIG. 10 illustrates a device for acquiring information bits using a parity bit sequence transmitted over a plurality of frames in a transmission device of a communication system.

Referring to FIG. 10, a frame decomposer 1010 extracts a basic parity bit sequence and at least one additional parity bit sequence in addition to a systematic bit sequence, from a transmission frame received by a predefined structure. The frame decomposer 1010 outputs the extracted systematic bit sequence, basic parity bit sequence and at least one additional parity bit sequence. The systematic bit sequence is provided to a decoder 1030 for decoding. Meanwhile, the basic parity bit sequence and the at least one additional parity bit sequence are instead provided to a parity reconstruction unit 1020 for restoration, as these sequences were already punctured in the transmission device.

If the systematic bit sequence, basic parity bit sequence and at least one additional parity bit sequence output from the frame decomposer 1010 were modulated by the transmission device, a demodulation procedure for the systematic bit sequence, basic parity bit sequence and at least one additional parity bit sequence may be performed in advance. Detailed descriptions of the decoding procedure and configuration are omitted for clarity and conciseness.

However, in the drawing, for convenience of description, the basic parity bit sequence and one or more additional parity bit sequences, which are output from the frame decomposer 1010 and output to the parity reconstruction unit 1020, are represented by LLR (Parity) and LLR (AP$_1$) to LLR (AP$_n$), respectively, on the assumption that these sequences are demodulated.

The parity reconstruction unit 1020 reconstructs the basic parity bit sequence LLR (Parity) and at least one additional parity bit sequence LLR (AP$_1$) to LLR (AP$_n$), considering that these sequences were punctured by a predetermined puncturing pattern in the transmission device. The parity reconstruction unit 1020 outputs the reconstructed basic parity bit sequence LLR (Parity) and the at least one additional parity bit sequence LLR (AP$_1$) to LLR (AP$_n$) to the decoder 1030.

The decoder 1030 decodes the systematic bit sequence provided from the frame decomposer 1010 and the basic parity bit sequence LLR (Parity) and one or more additional parity bit sequences LLR (AP$_1$) to LLR (AP$_n$) provided from the parity reconstruction unit 1020, and outputs the information bit sequence obtained by the decoding.

Figure 11:
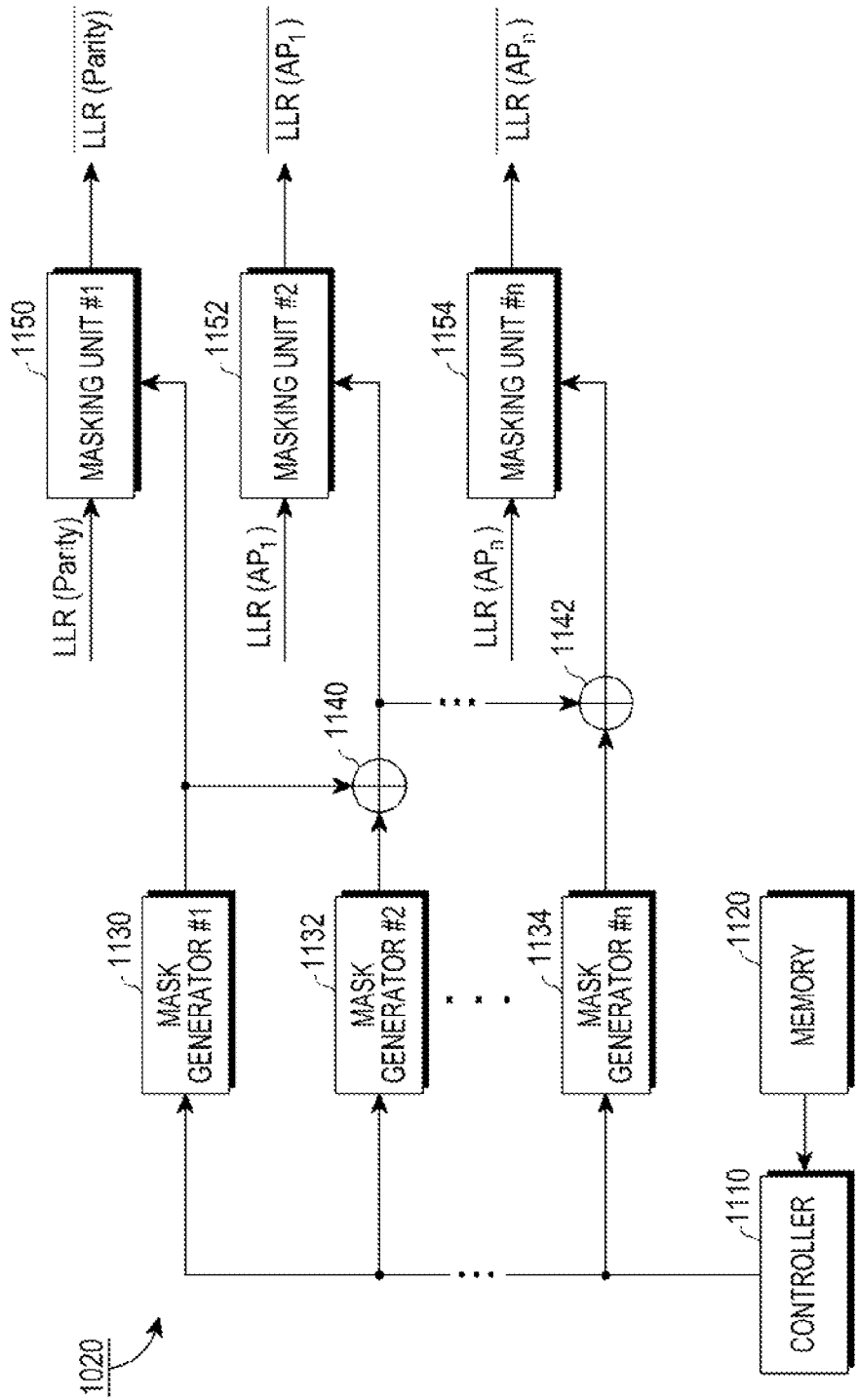
FIG. 11 is a block diagram illustrating a configuration of the parity reconstruction unit shown in FIG. 10 according to an embodiment of the present invention.

FIG. 11 is a block diagram illustrating a configuration of the parity reconstruction unit shown in FIG. 10 according to an embodiment of the present invention. The structure shown in FIG. 11 reconstructs one basic parity bit sequence and n additional parity bit sequences.

Referring to FIG. 11, a memory 1120 stores one or more masking patterns or puncturing patterns, which are preset to reconstruct a basic parity bit sequence and at least one additional parity bit sequence. Upon a request from a controller 1110, the memory 1120 outputs one of the requested number of masking patterns or puncturing patterns from among the stored one or more masking patterns or puncturing patterns.

The controller 1110 provides the masking patterns or puncturing patterns read out from the memory 1120 to first to third mask generators 1130, 1132 and 1134. For convenience of description, the term "masking pattern" hereinafter refers to both the masking pattern and the puncturing pattern.

The first mask generator 1130 generates a basic masking pattern using the masking pattern provided from the controller 1110. A first masking unit 1150 reconstructs a basic parity bit sequence LLR (Parity), which is a sequence existing before undergoing puncturing by the transmission device, by inserting the parity bits, which were punctured by the transmission device, into the basic parity bit sequence LLR (Parity) based on the basic masking pattern. The first masking unit 1150 outputs the reconstructed basic parity bit sequence LLR (Parity) to the decoder 1030.

The second mask generator 1132 generates a first secondary masking pattern using the masking pattern provided from the controller 1110. The first secondary masking pattern generated by the second mask generator 1132 and the basic masking pattern generated by the first mask generator 1130 undergo an OR operation (or a logical sum operation) by a logical operator 1140, generating a first additional masking pattern. A second masking unit 1152 reconstructs a first additional parity bit sequence LLR ($AP_1$), a sequence before undergoing puncturing by the transmission device, by inserting the parity bits, which were punctured by the transmission device, into the first additional parity bit sequence LLR ($AP_1$) based on the first additional masking pattern. The second masking unit 1152 outputs the reconstructed first additional parity bit sequence LLR ($AP_1$) to the decoder 1030.

The n-th mask generator 1134 generates an n-th secondary masking pattern using the masking pattern provided from the controller 1110. The n-th secondary masking pattern generated by the n-th mask generator 1134 and an (n−1)-th additional masking pattern generated by a logical operator in the previous stage undergo an OR operation by a logical operator 1142, generating an n-th additional masking pattern. The n-th masking unit 1154 reconstructs an n-th additional parity bit sequence LLR ($AP_n$), a sequence before undergoing puncturing by the transmission device, by inserting the parity bits, which were punctured by the transmission device, into the n-th additional parity bit sequence LLR ($AP_n$) based on the n-th additional masking pattern. The n-th masking unit 1154 outputs the reconstructed n-th additional parity bit sequence LLR ($AP_n$) to the decoder 1030.

As is apparent from the foregoing description, in embodiments of the present invention, the performance of the broadcasting system may be improved by generating an additional parity bit sequence(s) used to obtain the sufficient diversity gain. A variety of other effects may be explicitly or implicitly apparent from the foregoing description.

In the foregoing description, although the puncturing patterns are assumed to be stored in the memory in above-described embodiments of the present invention, the puncturing patterns may be generated by a sequence generator (not shown in the drawing) when necessary, in accordance with embodiments of the present invention.

While the invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A method for generating and transmitting a parity bit sequence by a transmission device in a communication system, comprising:
    generating a basic masking pattern according to a basic puncturing pattern;
    masking a parity bit sequence with the basic masking pattern;
    outputting, as a basic parity bit sequence, non-punctured parity bits that are remaining after the masking of the parity bit sequence with the basic masking pattern;
    generating a first secondary masking pattern according to a secondary puncturing pattern;
    generating a first additional masking pattern based on the basic masking pattern and the first secondary masking pattern,
    masking the parity bit sequence with the first additional masking pattern;
    outputting, as a first additional parity bit sequence, non-punctured parity bits that are remaining after the masking of the parity bit sequence with the first additional masking pattern; and
    transmitting, from the transmission device to a receiving device of the communication system, the output basic parity bit sequence and the output first additional parity bit sequence,
    wherein the first additional parity bit sequence is transmitted in a frame preceding a particular frame in which the basic parity bit sequence is transmitted.

2. The method of claim 1, wherein the first additional masking pattern is generated by performing a logical sum operation on the basic masking pattern and the first secondary masking pattern.

3. The method of claim 1, wherein the particular frame in which the basic parity bit sequence is transmitted and the frame in which the first additional parity bit sequence is transmitted are one from among a plurality of future extension frame (FEF) parts included in a super frame.

4. The method of claim 1, wherein the first additional masking pattern is generated by performing a modulo operation on the basic masking pattern and the first secondary masking pattern.

5. The method of claim 1, further comprising, encoding information bits using a predetermined coding technique and coding rate, and outputting a systematic bit sequence and the parity bit sequence.

6. The method of claim 1, further comprising,
    generating a second secondary masking pattern;
    generating a second additional masking pattern by performing a modulo operation on the first secondary masking pattern and the second secondary masking pattern;
    masking the parity bit sequence with the second additional masking pattern;
    outputting, as a second additional parity bit sequence, non-punctured parity bits that are remaining after the masking of the parity bit sequence with the second additional masking pattern; and
    transmitting the additional parity bit sequence in a frame.

* * * * *